United States Patent [19]

Dhong et al.

[11] Patent Number: 4,922,128

[45] Date of Patent: May 1, 1990

[54] BOOST CLOCK CIRCUIT FOR DRIVING REDUNDANT WORDLINES AND SAMPLE WORDLINES

[75] Inventors: Sang H. Dhong, Mahopac; Wei Hwang, Armonk; Nicky C. Lu, Yorktown Heights, all of N.Y.

[73] Assignee: IBM Corporation, Armonk, N.Y.

[21] Appl. No.: 296,995

[22] Filed: Jan. 13, 1989

[51] Int. Cl.$^5$ ...................... H03K 19/096; H03K 5/13
[52] U.S. Cl. .................... 307/269; 307/481; 328/104; 328/137; 328/154
[58] Field of Search ............ 307/497, 463, 269, 480, 307/481, 243, 242; 328/104, 137, 154; 365/189.01, 189.08, 230.02, 189.02

[56] References Cited

U.S. PATENT DOCUMENTS

| | | | |
|---|---|---|---|
| 2,867,723 | 1/1959 | Spaulding | 328/154 |
| 3,654,394 | 4/1972 | Gordon | 307/243 |
| 3,969,634 | 7/1976 | Machettii et al. | 328/154 |
| 4,490,626 | 12/1984 | Carlson | 328/154 |
| 4,494,018 | 1/1985 | Clemen et al. | 307/482 |
| 4,562,365 | 12/1985 | Redfield | 307/481 |
| 4,599,528 | 7/1986 | Redfield | 307/481 |
| 4,639,614 | 1/1987 | Basile | 307/243 |
| 4,794,275 | 12/1988 | Traa | 307/269 |

Primary Examiner—Stanley D. Miller
Assistant Examiner—Timothy P. Callahan
Attorney, Agent, or Firm—Pollock, Vande Sande & Priddy

[57] ABSTRACT

A boost clock signal generator which provides a boost clock signal from a pair of phase clocks. A pair of differentially-connected FET transistors which generate a boost clock signal. The transistors have drain connections connected to each of two clock signals, and commonly connected sources which form an output terminal for the boost clock signal. A series pass FET transistor is connected with each gate of the differential transistors for maintaining the gate at a floating voltage potential. A pair of capacitive elements couple the drain of each pair of differentially-connected FET transistors to the gate of an opposite transistor. A first and second logic circuit are connected to the series pass FET transistors for enabling one or the other of the differnetially-connected FET transistors into conduction. The pair of capacitive coupling elements coupling the drain of each pair of differentially-connected FET transistors to the gate of an opposite transistor increase switching speed of the clock signal generator.

9 Claims, 2 Drawing Sheets

BOOST CLOCK CIRCUIT FOR DRIVING REDUNDANT WORDLINES AND SAMPLE WORDLINES

BACKGROUND OF THE INVENTION

This invention relates to word driving circuitry for dynamic RAMs. Specifically, a boost clock circuit is provided which will generate clock pulses for driving redundant wordlines and sample word lines of a dynamic memory for either of two clock phases.

High density dynamic memories are routinely implemented with redundant word lines. The redundant wordlines are used when a tested memory has a failure of one or more word lines. When the memory has a defective wordline, it is possible by activating programmable fuses to activate one or more redundant wordlines. In a common dynamic memory organization, rows of memory cells are arranged in blocks of four. Addressing of rows occurs on alternate clock phases.

When a defective row line is replaced by a redundant row line, it is necessary to clock the row driver on either clock phase. Additionally, the dynamic memory is provided with a sample wordline for each section of memory rows which must be activated on either phase of the phase clocks. The reference line will provide a logic reference which is used to distinguish logic states of data produced by an actual row of the memory having data.

The coupling of either clock phase signal to the redundant wordline driver or sample wordline driver must be done with a circuit having a speed which will not significantly increase the access time for the dynamic memory. Further, to adequately reset the row driver clock lines and sample wordline driver clock lines, the coupling must provide a voltage boost below ground to a negative voltage which is more negatiave than the threshold voltage of the array device. Thus, the need for a boost clock which can provide clocking signals for the redundant wordlines and sample wordlines on each phase of the two phases of the phase clock at a speed which does not substantially increase access time is evident.

SUMMARY OF THE INVENTION

It is an object of this invention to provide a CMOS boost clock for redundant and sample wordline drivers of a dynamic RAM.

It is a more specific object of the invention to provide independent boost clock signals which do not significantly increase access time of a dynamic RAM.

These and other objects are provided by a CMOS circuit which is capable of providing each of two clock phases to a redundant wordline driver or sample wordline driver.

Two phase clock signals, only one of which is active during a memory RAS cycle, are individually coupled to the drain connection of two differentially connected FET transistors. The differentially connected FET transistors have source connections which form an output terminal for either clock phase signal.

The gate connections of the differential transistors are biased to float at a level of approximately 0 volts. The gates are connected to an output logic circuit which indicates that one or the other clock signal is active, and that the RAS strobe cycle is in progress.

To increase the speed of switching for the differential transistor pair, capacitive elements couple the drains of each transistor to the gates of the other transistor. Thus, the negative going clock signal level appearing on a drain of one transistor will force the other transistor towards a non-conducting state.

DESCRIPTION OF THE PREFERRED EMBODIMENT

Figure 1:
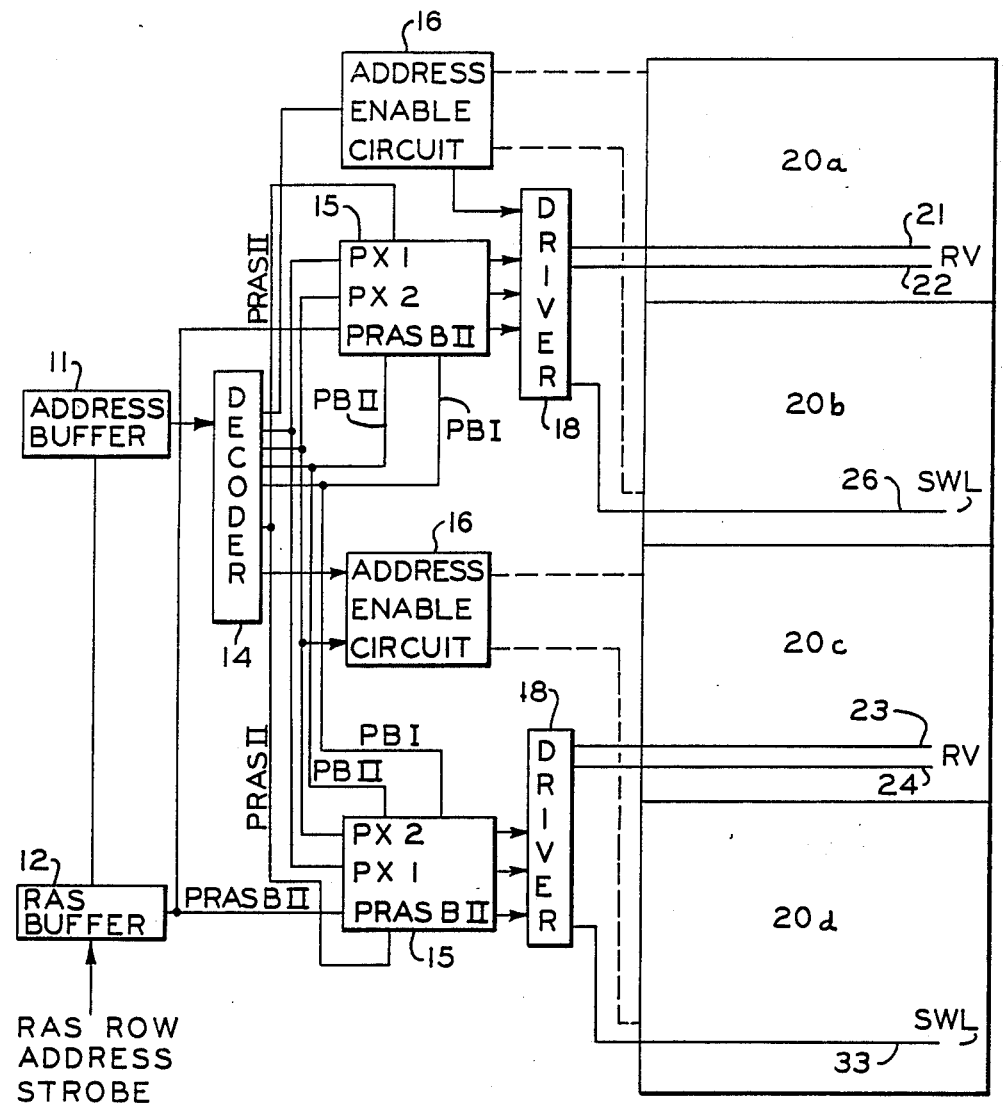
FIG. 1 illustrates the organization of a dynamic RAM including redundant wordlines and sample wordlines.

FIG. 1 illustrates the general organization of a dynamic random access memory (DRAM). The memory is shown as being subdivided into four sections 20a, 20b, 20c and 20d. Each pair of the RAM sections is shown to include a pair of redundant word lines 21, 22, 23 and 24. Each RAM half includes a sample wordline 26 and 33.

If it is necessary during the manufacture of a DRAM to activate one of the redundant wordlines, certain fusible links may be activated to connect the redundant word lines which are activated in place of a defective wordline. The sample word lines will additionally provide a sample logic level in which to compare the contents of each activated wordline, i.e., regular or redundant, which may be addressed by the address decoder 14.

The redundant wordlines are connected to a wordline driver 18. These wordlines may be suitably addressed by an address enable circuit 16. When a redundant word line is to be accessed, the driver circuit 18 will be enabled to receive a driving signal in synchronization with one or the other clock phases for that wordline.

Shown in FIG. 1 is a boost clock 15 which will supply the signal for the wordline driver 18 which is ultimately coupled to drive the wordline 21, 22, 23 and 24 into a read or write mode. These driving signals from the boost clock 15 are also used to drive the sample line 26.

A conventional address buffer 11 and RAS buffer 12 will cooperate in receiving address information for the DRAM 20. The decoder 14 will decode a particular address and apply the clocking signals needed to access the addressed memory location. The RAS buffer 12 will provide a strobe signal PRASBII to the boost clock 15.

The boost clock 15 receives two clock signals, PX1 and PX2 which are exclusive signals. One or the other of these signals is used to provide a clock time for the word driver circuits used to address the DRAM 20. The address enable circuit 16 receives one of the clock signals PX1, which is associated with clocking of the regular wordlines in the RAM half 20a and 20b. A similar address enable circuit 16 is shown for addressing that half of RAM 20 identified as 20c and 20d. Similarly, a boost clock circuit 15 is shown for providing the three drive signals for the redundant wordlines and sample wordlines.

When a redundant wordline is being selected by the decoder 14, it is necessary to drive the wordline on the occurrence of either a clock phase PX1 or clock phase PX2 which is normally used for the second half of the RAM 20c and 20d. The boost clock circuit 15 will provide the required drive signals, synchronized with the decoder 14 output signals.

Figure 2:
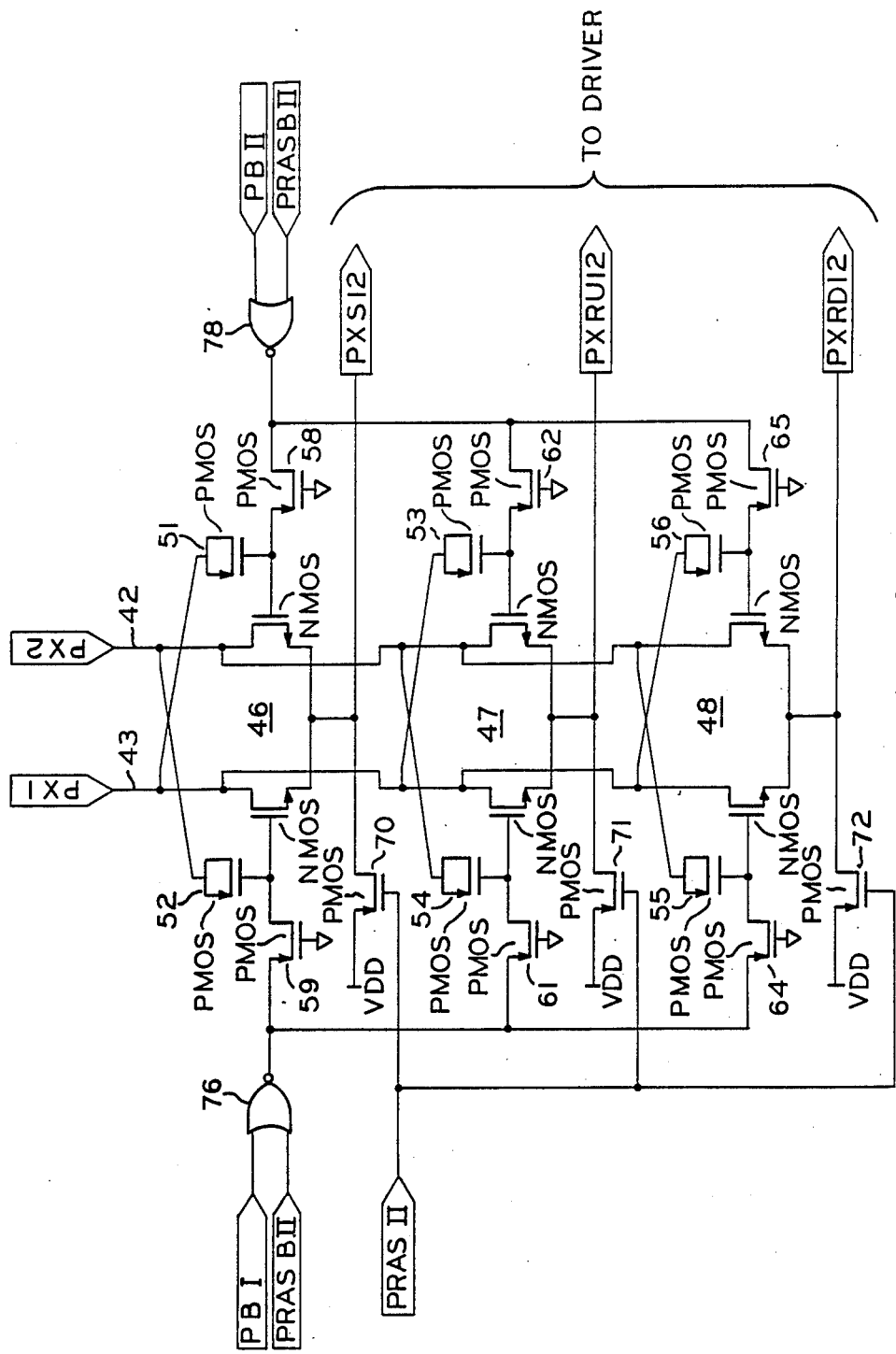
FIG. 2 illustrates a boost circuit which is capable of providing both redundant wordline clock signals and sample wordline clock signals.

A particular boost clock, which is a preferred embodiment of the present invention, useful for supplying a boost clock signal during either PX1 or PX2, is shown in FIG. 2. In this circuit, three different driver signals are generated, PXS12, PXRU12 and PXRD12. These drive signals will activate two redundant lines and a sample line. Additional boost clock circuits can be provided for as many additional redundant wordlines or sample wordlines as may be required for a particular DRAM architecture.

Shown in FIG. 2 are three pairs of differentially connected FET transistors 46, 47 and 48. These differentially connected transistors receive the clock signals PX1 and PX2 on the drain connections. These clock signals are connected to the drains of each pair of differentially connected transistors 46, 47 and 48.

The gates of each of these pairs of differentially connected transistors are maintained at a floating potential of approximately 0 volts. Series PMOS FET transistors 58, 59, 61, 62 and 64, 65 have a gate connection return to ground potential. This maintains the gates of the differential transistor pairs 46, 47 and 48 at approximately 0 volts.

Each of the connected source connections of differential transistor pairs 46, 47 and 48 form one of the output terminals PXS12, PXRU12 and PXRD12 for providing a drive signal for either a redundant wordline or a sample wordline of a DRAM.

The source connections for the differential transistor pairs 46, 47 and 48 is connected through a series FET gate 70, 71 and 72 to VDD, a source of positive potential. Normally, a gate signal PRASII is applied to the gates of each of transistors 70, 71 and 72. In a logic low state, PRASII will maintain the outputs PXS12, PXRU12, PXRD12 at a high level. Just prior to the appearance of a clock pulse PX1 or PX2, the decoder circuitry 14 of FIG. 1 will apply the PRASII signal as a high logic level, permitting the differential transistor pairs 46, 47 and 48 to follow the clock signal PX1 or PX2.

The decoder circuit 14 of FIG. 1 will provide an ENABLE signal to permit one or the other of clock signals PX1 or PX2 to propagate through to one of the driver signal terminals PXS12, PXRU12 and PXRD12. These logic circuits are shown as conventional NOR circuits 76 and 78, connected to the decoder 14 of FIG. 1.

In operation, one or the other of logic circuit 76 or 78 provides an enabling signal to the gate of one transistor of transistor pairs 46, 47 and 48 in response to signals PB1, PBII and PRASBII. The action of the transistor of a differential pair receiving the gate signal is to turn that particular transistor into a conducting mode. Additionally, one of a connected cross-coupling element, shown as an FET transistor with source and gate connected together, 51, 52, 53, 54, 55 and 56, couples the clock signal to the gate. The coupling elements 51, 52, 53, 54, 55 and 56 will, during the negative transition of a clock pulse applied to one of the drain connections, couple the negative transition to the opposite transistor in the transistor pair. Thus, a logic signal produced by logic circuit 78 will tend to turn the connected transistor of transistor pairs 46, 47 and 48 into a conducting state. The negative-going edge of the clock pulse connected to this transistor will tend to force the opposite transistor of the differential pair into a non-conducting state, thus turning off the opposite transistor. The source connection will therefore follow the phase clock from a positive VDD level to a negative −2 volts. The coupling provided by the connected coupling element will avoid the condition where the non-conducting transistor is inadvertently gated on by the lowering of the source voltage below the threshold voltage VTN of transistor pairs 46, 47 and 48. Since, in the first transistor pair 46, FET transistors 58 and 59 maintain the gate potentials floating in the absence of a logic signal, the cross-coupled clock signal will maintain this gate signal negatively biased, avoiding incidental turn-on of the transistor.

Thus, it is seen where each of the transistor pairs 46, 47 and 48 can provide one or the other clock signals, PX1, PX2, boosted below ground, to a connected driver circuit. It has been found that the capacitive coupling elements comprising transistors 51, 52, 53, 54, 55 and 56 are preferable over a direct coupling method. The capacitive coupling effectively isolates the unactivated clock PX1 or PX2 during the period the remaining clock is active. Direct coupling of each clock to the gate of an oppositely connected transistor of each transistor pair would provide feedback of a disadvantageous voltage pulse or glitch into the unactivated clock.

It is therefore seen how a boost clock for redundant wordlines or sample wordlines may be effected using cross-couples CMOS differential transistor pairs. Those skilled in the art will recognize yet other embodiments of the invention described more particularly by the claims which follow.

What is claimed is:

1. A boost clock signal generator which provides a boost clock signal from a pair of phase clock signals which synchronize reading of memory locations comprising:

a pair of differentially connected FET transistors for generating said boost clock signal, each of said transistors having a drain connection connected to one of said clock signals, and commonly connected source forming an output terminal;

a series pass FET transistor in series with each gate of said differentially connected transistors for maintaining each gate at a floating voltage potential;

a pair of capacitive coupling elements coupling the drain of each transistor of said pair of differentially connected FET transistors to the gate of an opposite transistor of said pair;

a first logic circuit connected to one of said series pass FET transistors; and, a second logic circuit connected to a remaining one of said series pass FET transistors, whereby one or the other of said differentially connected transistors is gated on by one of said logic circuits in response to an enable signal, and said transistor is driven into non-conduction by a signal coupled by one of said capacitive coupling elements.

2. A boost clock signal generator of claim 1 which produces clock signals from a pair of phase clock signals which synchronizes reading of memory addresses wherein said capacitive coupling elements are FET transistors.

3. The boost clock signal generator of claim 1 further comprising a control FET transistor connecting said differential transistor source connections to a source of DC potential, said control FET operatively supplying a control voltage to said output terminal in response to a logic signal applied to the gate of said control FET transistor.

4. The boost clock signal generator of claim 1 further comprising second and third identical boost clock generators, connected in parallel with said first boost clock signal generator.

5. The boost clock signal generator of claim 1 wherein said first and second logic circuits comprise a logical NOR circuit.

6. A boost clock signal generator for generating redundant clock signals from two synchronized phase clocks comprising:
   first, second and third pairs of differential FET transistors, each transistor of each pair of transistors having source connections connected together to form first, second and third output terminals, and each transistor of each pair of transistors having drain connections connected to one of said phase clocks;
   a first logic circuit;
   a second logic circuit;
   first, second and third pairs of FET gate transistors, each transistor of each pair of FET gate transistors serially connected to a gate connection of said differential transistor pairs and connected to a respective one of first and second logic circuits, said transistor maintaining said differential transistor gates at a floating potential, said first and second logic circuits enabling one transistor of each differential pair of transistors to connect one of said clock signals to said first, second and third output terminals; and,
   first, second and third pairs of capacitive coupling elements, each capacitive coupling element of each pair connecting the drains of each transistor of said differential transistor pairs to the gate of the remaining transistor of a respective pair of differential transistors, said capacitive coupling elements increasing the speed at which said differential transistors switch from a non-conducting to a conducting state.

7. The boost clock signal generator of claim 6 wherein said capacitive coupling elements comprise FET transistors having their source connected to their gate connection and to one transistor of said differential pair, and a gate connected to a remaining differential transistor of said pair.

8. The boost clock signal generator of claim 6 further comprising first, second and third series FET transistors connected to said first, second and third output terminals for coupling a logic signal common to each gate of said series FET transistors to said first, second and third output terminals.

9. The boost clock signal generator of claim 6 wherein said first and second logic circuits comprise a NOR circuit.

* * * * *

UNITED STATES PATENT AND TRADEMARK OFFICE
CERTIFICATE OF CORRECTION

PATENT NO. : 4,922,128

DATED : May 1, 1990

INVENTOR(S) : Dhong et al

It is certified that error appears in the above-identified patent and that said Letters Patent is hereby corrected as shown below:

On the title page, in the abstract, 6 lines from the bottom of the text, change "differnetially" to --differentially--.

Signed and Sealed this

Twenty-fifth Day of August, 1992

Attest:

DOUGLAS B. COMER

Attesting Officer

Acting Commissioner of Patents and Trademarks